United States Patent

Jin et al.

[11] Patent Number: 5,940,716
[45] Date of Patent: Aug. 17, 1999

[54] METHODS OF FORMING TRENCH ISOLATION REGIONS USING REPATTERNED TRENCH MASKS

[75] Inventors: Joo-hyun Jin; Yun-seung Shin, both of Seoul, Rep. of Korea

[73] Assignee: Samsung Electronics Co., Ltd., Rep. of Korea

[21] Appl. No.: 08/818,257

[22] Filed: Mar. 14, 1997

[30] Foreign Application Priority Data

Mar. 15, 1996 [KR] Rep. of Korea .......................... 96-6981

[51] Int. Cl.$^6$ ................................................. H01L 21/762
[52] U.S. Cl. ............................................................ 438/424
[58] Field of Search ................................... 438/424, 427, 438/435, 437, FOR 227, 692; 148/DIG. 50, DIG. 85, DIG. 86

[56] References Cited

U.S. PATENT DOCUMENTS

| | | |
|---|---|---|
| 5,521,422 | 5/1996 | Mandelman et al. . |
| 5,554,256 | 9/1996 | Pruijmboom et al. . |
| 5,578,518 | 11/1996 | Koike et al. . |
| 5,677,233 | 10/1997 | Abiko . |
| 5,712,185 | 1/1998 | Tsai et al. . |
| 5,834,358 | 11/1998 | Pan et al. . |
| 5,837,612 | 11/1998 | Ajuria et al. . |
| 5,863,827 | 1/1999 | Joyner . |

FOREIGN PATENT DOCUMENTS 61-137338  6/1986  Japan .

Primary Examiner—George R. Fourson
Attorney, Agent, or Firm—Myers Bigel Sibley & Sajovec

[57] ABSTRACT

Methods of forming trench isolation regions include the steps of forming trenches in a semiconductor substrate using an etching mask having openings therein, and then patterning the mask to enlarge the openings. The trenches and the enlarged openings are then filled with an electrically insulating material and then the insulating material is planarized using a polishing technique (e.g., CMP) and/or a chemical etching technique, to define the final trench isolation regions. Here, at least a portion of the etching mask is also used as a planarization stop. Using these methods, trench isolation regions can be formed having reduced susceptibility to edge defects because the periphery of the trench at the face of the substrate is covered by the electrically insulating material. In particular, a preferred method of forming a trench isolation region includes the steps of forming a trench masking layer on a face of a semiconductor substrate and then patterning the masking layer to define at least a first opening therein which exposes a first portion of the face. The exposed first portion of the face of the substrate is then preferably etched to define a trench therein, using the trench masking layer as an etching mask. The trench masking layer is then repatterned to enlarge the size of the first opening. An electrically insulating region is then formed in the trench and in the enlarged first opening using a preferred deposition technique. Finally, the insulating region is planarized to be level with an upper surface of the trench masking layer, by using the trench masking layer as a planarization stop.

15 Claims, 7 Drawing Sheets

METHODS OF FORMING TRENCH ISOLATION REGIONS USING REPATTERNED TRENCH MASKS

FIELD OF THE INVENTION

The present invention relates to semiconductor devices and fabrication methods, and more particularly to methods of fabricating electrically isolated semiconductor active regions in a semiconductor substrate.

BACKGROUND OF THE INVENTION

Device isolation techniques play an important role in the design and performance of highly integrated semiconductor circuits by electrically isolating regions and devices therein from adjacent devices and regions. Moreover, as the degree of integration in semiconductor circuits increases, there is a concomitant need to develop techniques for forming isolation regions which are free of defects and can be scaled to provide isolation regions having smaller dimensions, but without sacrificing the isolation capability of the regions.

One widely used and relatively simple technique for providing device isolation is typically referred to as local oxidation of silicon (LOCOS). Unfortunately, this technique has a number of disadvantages because it typically includes the formation of bird's beak oxide extensions, induces lattice stress which can lead to the formation of crystal defects in semiconductor substrates, and causes redistribution of channel-stop dopants. As will be understood by those skilled in the art, these disadvantages typically cause a reduction in the lateral area available for active devices, and degrade the reliability and performance of devices formed in adjacent active regions.

Another method which may be considered an improvement over the LOCOS method is typically referred to as the shallow trench isolation (STI) method. In the STI method, a device isolation region is established by selectively etching a semiconductor substrate to form trenches therein and then filling the trenches with an electrically insulating region (e.g., oxide). A chemical etching and/or chemical-mechanical polishing (CMP) step can then be performed to planarize the electrically insulating region to be level with the surface of the substrate. Because the STI method typically does not include a lengthy thermal oxidation step as typically required by the LOCOS method, many of the disadvantages of the LOCOS method can be eliminated to some degree. However, as will be understood by those skilled in the art, the STI method may be prone to a "dishing" phenomenon which can degrade the isolation characteristics of trench isolation regions.

Hereinafter, a conventional trench isolation method for a semiconductor device will be described with reference to FIGS. 1 through 6. First, referring to FIG. 1, a pad oxide layer 12 and a nitride layer 14 are deposited on a semiconductor substrate 10 in sequence. The pad oxide layer 12 functions as a protection layer for an active region during the formation of a trench. Then, a photoresist pattern 16, for defining a region in which the trench is to be formed, is formed on the nitride layer 14. Then, as shown in FIG. 2, the nitride layer 14 and the pad oxide layer 12 are etched in sequence using the photoresist pattern 16 as an etching mask to form a nitride layer pattern 14A and a pad oxide layer pattern 12A. Then, the semiconductor substrate 10 is dry-etched to form a trench 17 with a predetermined depth. Next, as shown in FIG. 3, after removing the photoresist pattern 16, an oxide layer 18 is formed on the nitride layer pattern 14A with a predetermined thickness while completely filling the trench 17, using a chemical vapor deposition (CVD) method.

Then, as shown in FIG. 4, the oxide layer 18 is planarized by a chemical mechanical polishing (CMP) process, using the surface of the nitride layer pattern 14A as a planarization stop, to form a field oxide layer pattern 18A. Thereafter, as shown in FIG. 5, the nitride layer pattern 14A and the pad oxide layer pattern 12A are removed to define the trench isolation region 18A. Then, a sacrificial oxidation process and a cleaning process are performed to complete a trench isolation region 18B as shown in FIG. 6.

However, according to the conventional trench isolation method, the edge portion of the oxide layer filling the trench is also etched by the sacrificial oxidation process or the cleaning process, showing a profile such as portion "A" shown in FIG. 6. That is, the device isolation region is slanted at the upper boundary between the active region and the device isolation region, so that a gate oxide layer becomes thinner at the boundary and an electric field is concentrated thereon. Also, stress may be applied to an upper insulation region to be formed in a following step. This stress can promote the generation of leakage currents and otherwise deteriorate the characteristics of the devices formed in adjacent active regions.

Thus, notwithstanding the above described methods, there continues to be a need for improved methods of forming field oxide isolation regions which are compatible with very large scale integration (VLSI) processing techniques.

SUMMARY OF THE INVENTION

It is therefore an object of the present invention to provide improved methods of forming electrical isolation regions in semiconductor substrates.

It is another object of the present invention to provide methods of forming trench isolation regions which are less susceptible to edge defects.

It is yet another object of the present invention to provide methods of forming isolation regions which require a reduced number of photolithographic alignment steps.

These and other objects, features and advantages of the present invention are provided by methods of forming trench isolation regions which include the steps of forming trenches in a semiconductor substrate using an etching mask having openings therein, and then patterning the mask to enlarge the openings. The trenches and the enlarged openings are then filled with an electrically insulating material and then the insulating material is planarized using a polishing technique (e.g., CMP) and/or a chemical etching technique, to define the final trench isolation regions. Here, at least a portion of the etching mask is also used as a planarization stop. Using these methods, trench isolation regions can be formed having reduced susceptibility to edge defects because the periphery of the trench at the face of the substrate is covered by the electrically insulating material.

According to one embodiment of the present invention, a preferred method of forming a trench isolation region includes the steps of forming a trench masking layer on a face of a semiconductor substrate and then patterning the masking layer to define at least a first opening therein which exposes a first portion of the face. The exposed first portion of the face of the substrate is then preferably etched to define a trench therein, using the trench masking layer as an etching mask. The trench masking layer is then repatterned to enlarge the size of the first opening. An electrically insulating region is then formed in the trench and in the enlarged first opening using a preferred deposition technique. Finally, the insulating region is planarized to be level with an upper surface of the trench masking layer, by using the trench masking layer as a planarization stop.

According to another embodiment of the present invention, a preferred method includes the steps of forming a masking layer containing nitride (e.g., $Si_3N_4$) on a face of a semiconductor substrate and then patterning the masking layer to define a trench mask having a first opening therein which exposes the face. The semiconductor substrate is then etched to define a trench therein, using the trench mask as an etching mask. The size of the first opening in the trench mask is then enlarged by exposing the trench and trench mask to an etchant which etches nitride at a faster rate than the semiconductor substrate. For example, the first opening may be enlarged by exposing the trench mask to a phosphoric acid solution at a temperature of greater than about 140° C., for a duration greater than about 10 minutes. This step will preferably cause an edge of the trench mask at the first opening to recess by greater than about 500 Å from an edge of the trench. The trench and the enlarged first opening are then filled with an electrically insulating region. The electrically insulating region is then planarized using at least a portion of the masking layer as a planarization stop so that trench isolation regions can be formed having reduced susceptibility to edge defects because the periphery of the trench at the face of the substrate is covered by the electrically insulating region.

DESCRIPTION OF PREFERRED EMBODIMENTS

Figure 1:
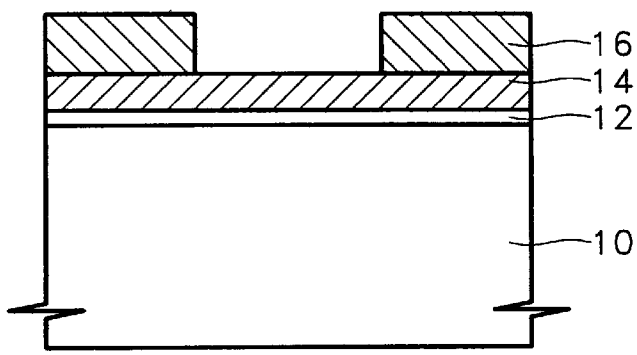
FIGS. 1–6 illustrate schematic cross-sectional views of intermediate structures illustrating a method of forming trench isolation regions according to the prior art.
Figure 2:
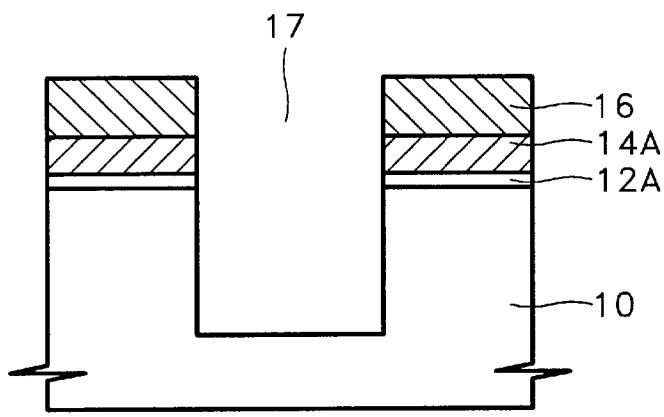
Figure 3:
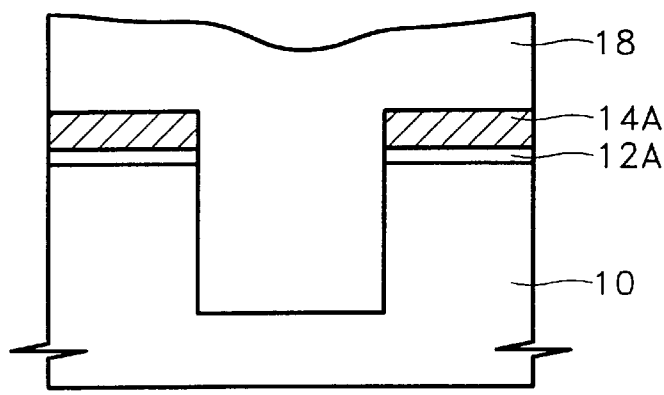
Figure 4:
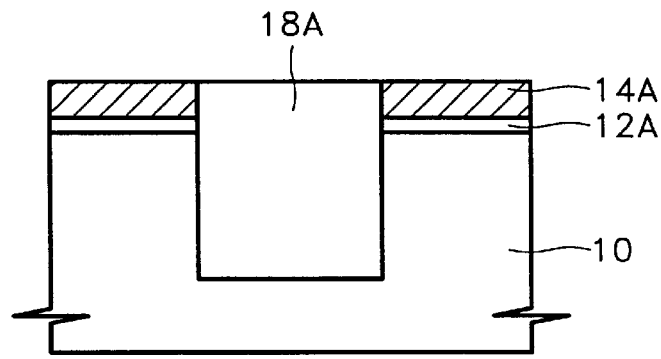
Figure 5:
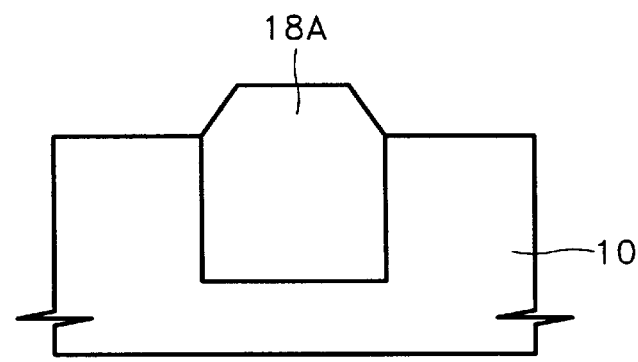
Figure 6:
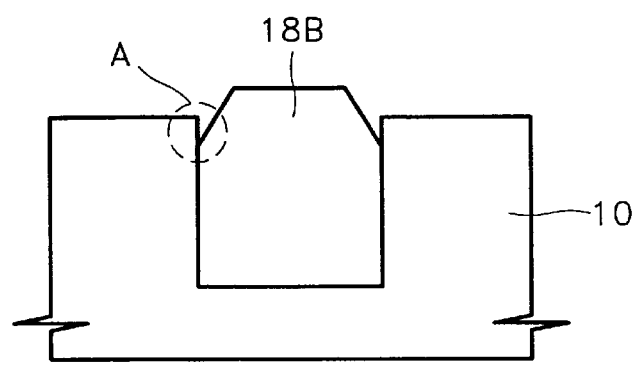

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

Referring now to FIGS. 7–14, a preferred method of forming a trench isolation region according to a first embodiment of the present invention will be described. In particular, as illustrated best by FIG. 7, a masking layer comprising a composite of a protective layer 102 and an intermediate layer 104 are formed in sequence on a face of a semiconductor substrate 100. Preferably, the intermediate layer 104 is made of a material which can be etched at a faster rate than the rate at which the protective layer 102 can be etched using such chemical etchants as phosphoric acid ($H_3PO_4$). For example, the protective layer 102 may comprise silicon dioxide ($SiO_2$) and the intermediate layer 104 may comprise silicon nitride ($Si_3N_4$) which can be etched faster than silicon dioxide (and silicon) when exposed to a phosphoric acid solution. The protective layer 102 may have a thickness of about 100–200 Å and the intermediate layer 104 may have a thickness of about 2000–3000 Å. The protective layer 102 is also preferably formed of a material which can function as a "stress" buffer to protect subsequently defined active regions in the substrate 100.

Figure 7:
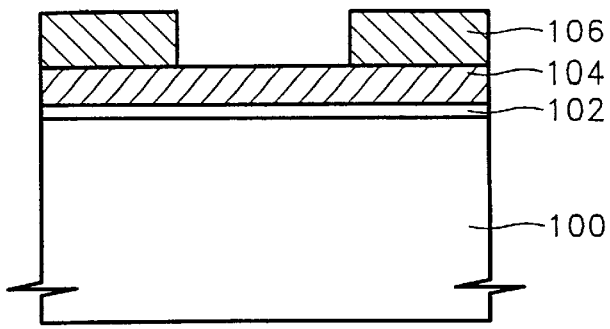
FIGS. 7–14 illustrate schematic cross-sectional views of intermediate structures illustrating a method of forming trench isolation regions according to a first embodiment of the present invention.
Figure 8:
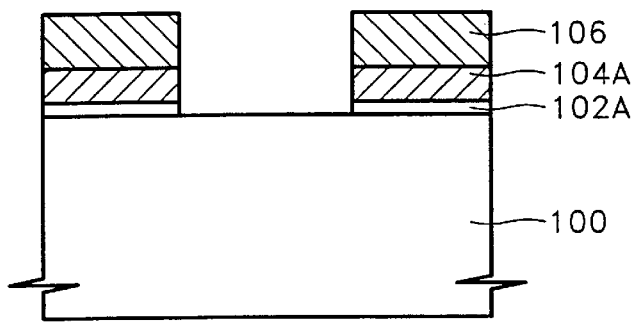
Figure 9:
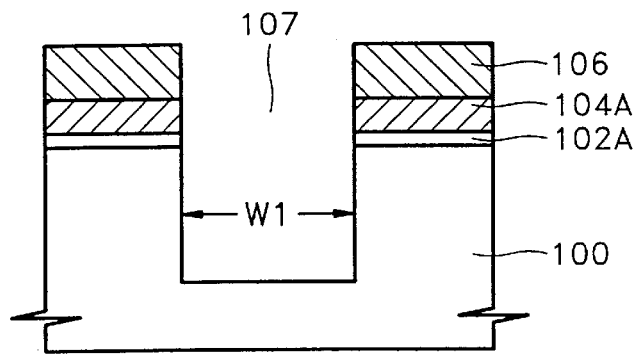

Referring still to FIG. 7, a layer of photoresist 106 is deposited on the intermediate layer 104 and then patterned as a photoresist mask. Then, as illustrated best by FIG. 8, the intermediate layer 104 and protective layer 102 are anisotropically etched in sequence to form a trench masking layer which in the first embodiment comprises a protective mask 102A and an intermediate mask 104A. Referring now to FIG. 9, the semiconductor substrate 100 is then anisotropically etched using the photoresist mask 106, and the trench masking layer as an etching mask, to form at least one trench 107 having a width W1 when viewed in transverse cross-section. Here, the trench 107 is etched to a depth in a range between about 3,500 Å and 4000 Å. A stress relief oxide layer having a thickness in a range between about 100 Å–300 Å may then be formed on the sidewalls and the bottom of the trench 107 using a thermal oxidation step. This step is preferably performed to remove excess damage inflicted on the substrate 100 during the trench etching step and also to planarize the surface of the trench 107. The stress relief oxide layer is then exposed to a hydrofluoric acid (HF) solution for about 300 seconds (5 minutes) to remove any remaining oxide from the edges of the intermediate mask 104A, while the stress relief oxide layer on the surface of the trench 107 remains.

Figure 10:
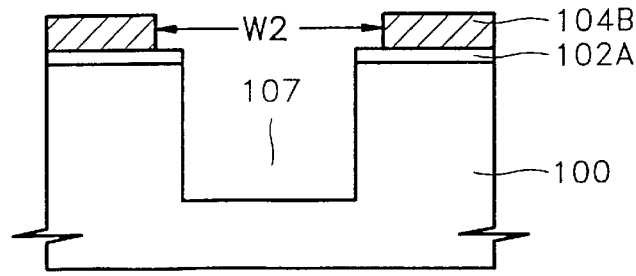

Referring now to FIG. 10, the photoresist mask 106 is then removed and then the size of the opening in the intermediate mask 104A is enlarged by exposing the trench masking layer and the trench 107 to a phosphoric acid ($H_3PO_4$) solution at a temperature of about 140–160° C. for a duration of about 10–20 minutes. During this step, the intermediate mask 104A is selectively etched because phosphoric acid etches silicon nitride at a faster rate than silicon dioxide and at a faster rate than the semiconductor substrate. For example, when the treatment using the phosphoric acid solution is performed at 150° C. for about 15 minutes, the edges of the intermediate mask 104A recess by about 700 Å from an edge of the trench so that the size of the opening W2 in the patterned intermediate mask 104B is greater than W1 (i.e., the trench width) by about 1,400 Å.

Figure 11:
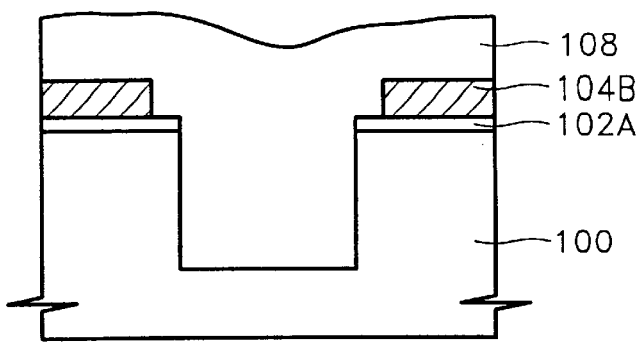
Figure 12:
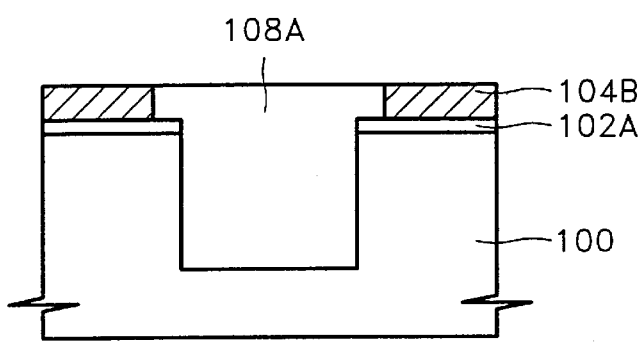

Referring now to FIG. 11, an electrically insulating region 108 comprising silicon dioxide, for example, and having a thickness in a range between about 5000–7000 Å, is then deposited using a chemical vapor deposition (CVD) technique to fill the trench and the enlarged opening in the patterned intermediate mask 104B, as illustrated. The electrically insulating region 108 also extends onto an upper surface of the intermediate mask 104B. Then, as illustrated best by FIG. 12, the electrically insulating region 108 is planarized to form a trench isolation region 108A which covers a periphery of the trench at the face of the substrate. Here, the step of planarizing the electrically insulating region 108 may be performed using, for example, a chemical-mechanical polishing (CMP) step alone or in combination with a chemical etch-back step, as will be understood by those skilled in the art. According to a preferred aspect of the present invention, the patterned intermediate mask 104B (e.g., silicon nitride) is used as a planarization/etch-stop.

Figure 13:
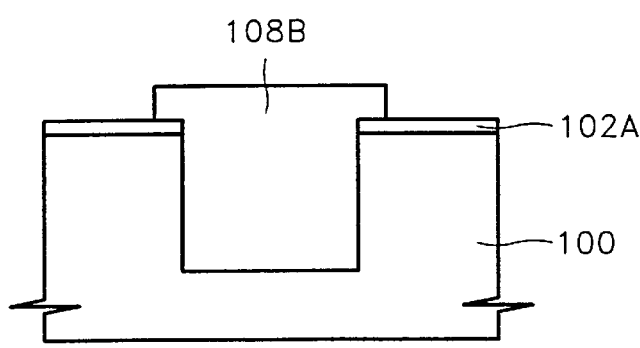
Figure 14:
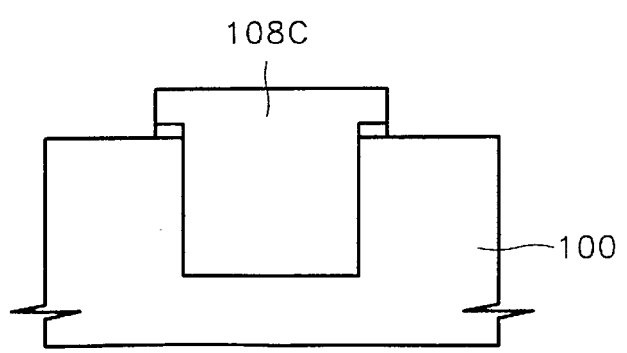

Referring now to FIG. 13, the patterned intermediate mask 104B is then removed by performing a dry etching step or by performing a wet etching step using a phosphoric acid solution, to expose the underlying protective mask 102A which, as described above, may comprise silicon dioxide. The protective mask 102A is then removed using conventional etching techniques to define a final trench isolation region 108C having a T-shape when viewed in transverse cross-section, as illustrated by FIG. 14. Thus, according to this first embodiment of the present invention, the final trench isolation region 108C has extensions which overlap and cover the entrance or periphery of the trench 107 so that those portions of the active regions which extend adjacent the sidewalls of the trench will not be exposed even as the patterned intermediate mask 104B and protective mask 102A are removed, typically by using dry and/or wet etching techniques.

Referring now to FIGS. 15–22, a preferred method of forming a trench isolation region according to a second embodiment of the present invention will be described. In particular, as illustrated best by FIG. 15, a masking layer comprising a composite of a protective layer 202, an intermediate layer of a first material 204 and a capping layer 206 of a second material, are formed in sequence on a face of a semiconductor substrate 200. Preferably, the intermediate layer 204 is made of a material which can be etched at a faster rate than the rate at which the protective layer 202 and capping layer 206 can be etched using such chemical etchants as phosphoric acid ($H_3PO_4$). For example, the protective layer 202 may comprise silicon dioxide ($SiO_2$), the intermediate layer 204 may comprise silicon nitride ($Si_3N_4$) and the capping layer 206 may comprise polycrystalline silicon. According to a preferred aspect of the present invention, the intermediate layer 204 can be etched faster than silicon dioxide and polycrystalline silicon when exposed to a phosphoric acid solution. The protective layer 202 may have a thickness of about 100–200 Å, the intermediate layer 204 may have a thickness of about 2000–3000 Å and the capping layer 206 may have a thickness of about 700–1200 Å. The protective layer 202 is also preferably formed of a material which can function as a "stress" buffer to protect subsequently defined active regions in the substrate 200.

Figure 15:
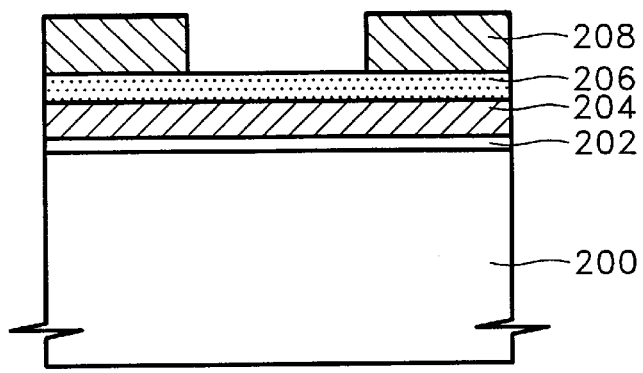
FIGS. 15–22 illustrate schematic cross-sectional views of intermediate structures illustrating a method of forming trench isolation regions according to a second embodiment of the present invention.
Figure 16:
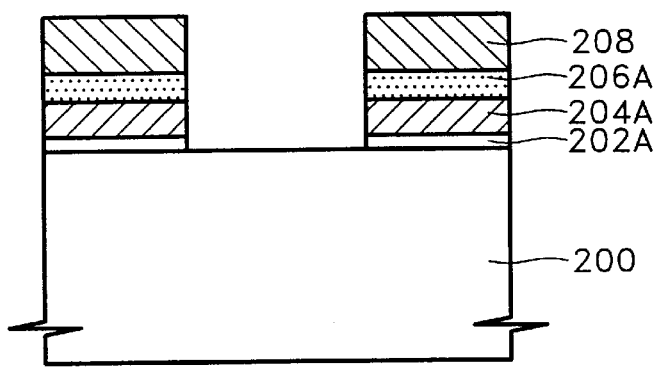
Figure 17:
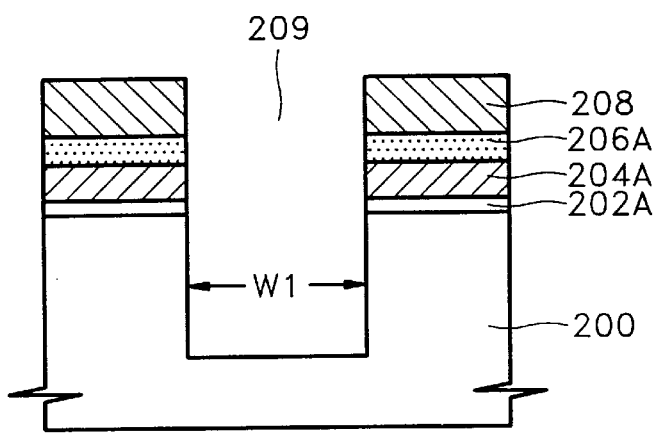

Referring still to FIG. 15, a layer of photoresist 208 is deposited on the capping layer 206 and then patterned as a photoresist mask. Then, as illustrated best by FIG. 16, the capping layer 206, the intermediate layer 204 and the protective layer 202 are anisotropically etched in sequence to form a trench masking layer which in the first embodiment comprises a protective mask 202A, an intermediate mask 204A and a capping mask 206A. Referring now to FIG. 17, the semiconductor substrate 200 is then anisotropically etched using the photoresist mask 208, and the trench masking layer as an etching mask, to form at least one trench 209 having a width W1 when viewed in transverse cross-section. Here, the trench 209 is etched to a depth in a range between about 3,500 Å and 4000 Å. A stress relief oxide layer having a thickness in a range between about 100 Å–300 Å may then be formed on the sidewalls and the bottom of the trench 209 using a thermal oxidation step. This step is preferably performed to remove excess damage inflicted on the substrate 200 during the trench etching step and also to planarize the surface of the trench 209. The stress relief oxide layer is then exposed to a hydrofluoric acid (HF) solution for about 300 seconds (5 minutes) to remove any remaining oxide from the edges of the intermediate mask 204A, while the stress relief oxide layer on the surface of the trench 209 remains.

Figure 18:
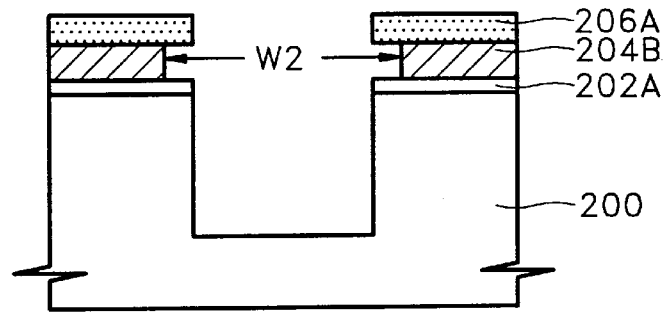

Referring now to FIG. 18, the photoresist mask 208 is then removed and then the size of the opening in the intermediate mask 204A is enlarged by exposing the trench masking layer and the trench 209 to a phosphoric acid ($H_3PO_4$) solution at a temperature of about 140–160° C. for a duration of about 10–20 minutes. During this step, the intermediate mask 104A is selectively etched because phosphoric acid etches silicon nitride at a faster rate than silicon dioxide, polycrystalline silicon and the semiconductor substrate 200. For example, when the treatment using the phosphoric acid solution is performed at 150° C. for about 15 minutes, the edges of the intermediate mask 204A recess by about 700 Å from an edge of the trench so that the size of the opening W2 in the patterned intermediate mask 204B is greater than W1 (i.e., the trench width) by about 1,400 Å.

Figure 19:
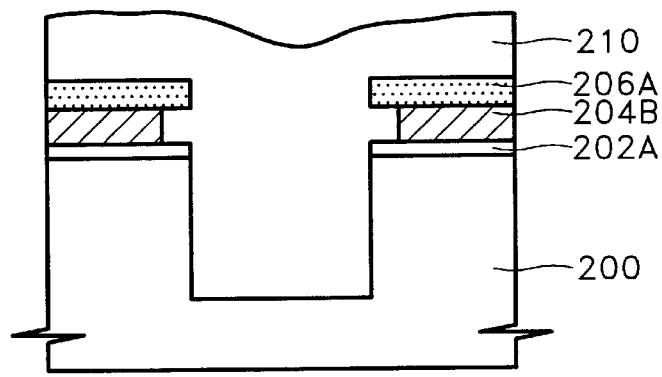
Figure 20:
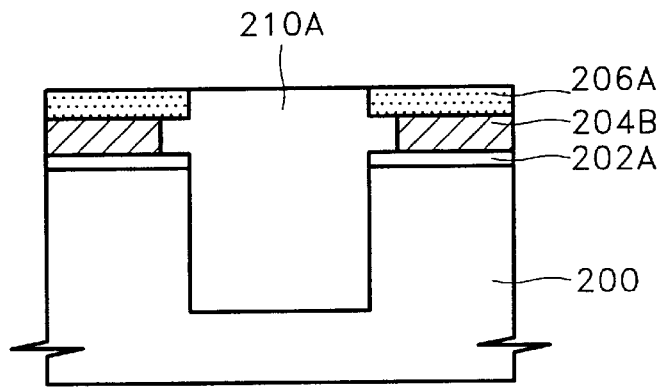

Referring now to FIG. 19, an electrically insulating region 210 comprising silicon dioxide, for example, and having a thickness in a range between about 5000–7000 Å, is then deposited using a chemical vapor deposition (CVD) technique to fill the trench and the enlarged opening in the patterned intermediate mask 204B, as illustrated. The electrically insulating region 210 also extends onto an upper surface of the capping mask 206A. Then, as illustrated best by FIG. 20, the electrically insulating region 210 is planarized to form a trench isolation region 210A which covers a periphery of the trench at the face of the substrate. Here, the step of planarizing the electrically insulating region 210 may be performed using, for example, a chemical-mechanical polishing (CMP) step alone or in combination with a chemical etch-back step, as will be understood by those skilled in the art. According to a preferred aspect of the present invention, the patterned capping mask 206A (e.g., polycrystalline silicon) is used as a planarization/etch-stop.

Figure 21:
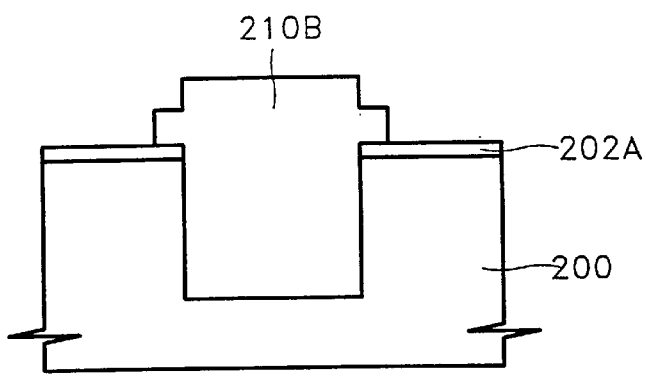
Figure 22:
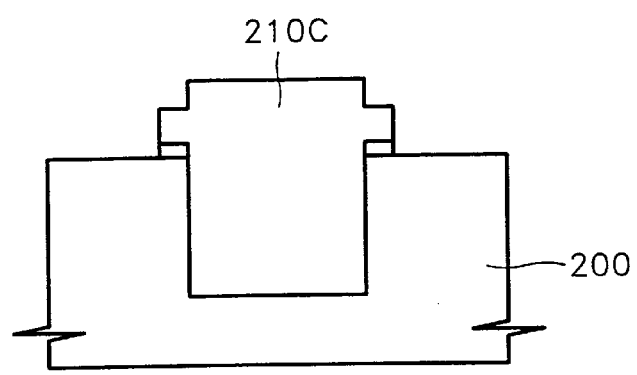
Figure 23:
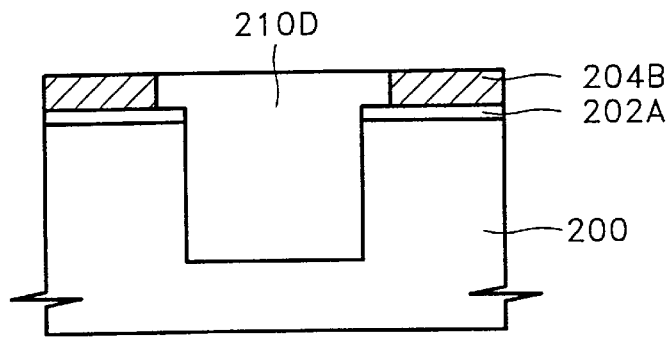
FIGS. 23–24 illustrate schematic cross-sectional views of intermediate structures which when combined with the cross-sectional views of FIGS. 15–19 illustrate a method of forming trench isolation regions according to a third embodiment of the present invention.

Referring now to FIG. 21, the capping mask 206A is then removed by performing a dry etching step or by performing a wet etching step using a mixed solution including nitric acid ($HNO_3$), acetic acid ($CH_3COOH$), hydrofluoric acid (HF) and distilled water. The intermediate mask 204B is also removed by performing a dry etching step or by performing a wet etching step using a phosphoric acid solution, to expose the underlying protective mask 202A which, as described above, may comprise silicon dioxide. Finally, the protective mask 202A is removed using conventional etching techniques to define a final trench isolation region 210C having a T-shape when viewed in transverse cross-section, as illustrated by FIG. 22. Thus, according to this second embodiment of the present invention, the final trench isolation region 210C has extensions which overlap and cover the entrance or periphery of the trench 209 so that those portions of the active regions which extend adjacent the sidewalls of the trench will not be exposed even as the patterned intermediate mask 204B and protective mask 202A are removed, typically by using dry and/or wet etching techniques.

Referring now to FIGS. 15–19 and 23-24, a preferred method of forming a trench isolation region according to a third embodiment of the present invention will be described. This third embodiment is similar to the above-described second embodiment, however, the capping layer 206 of FIG. 15 is not formed of polycrystalline silicon but, instead, is formed of an electrically insulating material such as silicon dioxide and then the above-described steps of FIG. 15–19 are performed. Then, as illustrated best by FIG. 23, the electrically insulating region 210 is planarized to form a trench isolation region 210D which covers a periphery of the trench at the face of the substrate. Here, the step of planarizing the electrically insulating region 210 may be performed using, for example, a chemical-mechanical polishing (CMP) step alone or in combination with a chemical etch-back step, as will be understood by those skilled in the art. According to a preferred aspect of the present invention, the intermediate mask 204B (e.g., silicon nitride) is used as a planarization/etch-stop.

Figure 24:
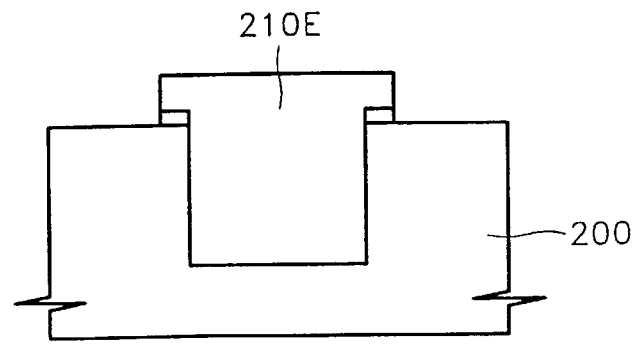

Then, as illustrated best by FIG. 24, the patterned intermediate mask 204B is removed by performing a dry etching step or by performing a wet etching step using a phosphoric acid solution, to expose the underlying protective mask 202A which, as described above, may comprise silicon dioxide. The protective mask 202A is then removed using conventional etching techniques to define a final trench isolation region 210E having a T-shape when viewed in transverse cross-section. Thus, according to this third embodiment of the present invention, the final trench isolation region 210E has extensions which overlap and cover the entrance or periphery of the trench so that those portions of the active regions which extend adjacent the sidewalls of the trench will not be exposed even as the patterned intermediate mask 204B and protective mask 202A are removed, typically by using dry and/or wet etching techniques. This improves the profile of the edge portions of the device isolation region which means that the concentration of the electric fields at the edge portions can be reduced and the stress applied to the trench isolation region can also be reduced so that a semiconductor device having improved characteristics can be fabricated in the active semiconductor regions on opposite sides of the trench isolation region.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a trench isolation region, comprising the steps of:
    forming a trench masking layer on a face of a semiconductor substrate, said trench masking layer having a first opening therein which is defined by first sidewalls thereof and exposes a first portion of the face;
    etching the exposed first portion of the face of the semiconductor substrate to define a trench therein, using the trench masking layer as an etching mask; then
    patterning the trench masking layer to enlarge the size of the first opening therein;
    forming an electrically insulating region in the trench and in the enlarged first opening in the trench masking layer; and
    planarizing the electrically insulating region;
    wherein said step of patterning the trench masking layer comprises etching the trench masking layer at a periphery of the first opening by exposing the trench masking layer and trench to an etchant which selectively etches at least a portion of the trench masking layer at a faster rate relative to a rate at which the trench is etched;
    wherein said step of forming a trench masking layer comprises forming a trench masking layer as a composite of a first layer of a first material and a second layer of a second different material; and
    wherein said step of patterning the trench masking layer comprises etching the trench masking layer at the periphery of the first opening by simultaneously exposing the the first and second layers to an etchant at the first sidewalls which selectively etches the first layer of a first material at a faster rate relative to a rate at which the second layer of a second material is etched.

2. The method of claim 1, wherein the first layer of a first material comprises silicon nitride and wherein the second layer of a second material comprises polycrystalline silicon.

3. The method of claim 2, wherein said step of patterning the trench masking layer comprises etching the trench masking layer at the periphery of the first opening by exposing the trench masking layer to a solution containing phosphoric acid.

4. The method of claim 3, wherein said step of planarizing the electrically insulating region comprises planarizing the electrically insulating region using the second layer of a second material as a planarization stop.

5. The method of claims 4, wherein said step of patterning the trench masking layer comprises exposing the trench masking layer to the solution containing phosphoric acid for a duration greater than about 10 minutes.

6. The method of claim 1, wherein the first layer of a first material comprises silicon nitride and wherein the second layer of a second material comprises silicon dioxide.

7. The method of claim 6, wherein said step of planarizing the electrically insulating region comprises planarizing the electrically insulating region and the second layer of a second material, using the first layer of a first material as a planarization stop.

8. The method of claim 7, wherein said step of patterning the trench masking layer comprises etching the trench masking layer at the periphery of the first opening by exposing the trench masking layer to a solution containing phosphoric acid.

9. A method of forming a trench isolation region, comprising the steps of:
    forming a masking layer containing a composite of a first material comprising nitride and a second material selected from the group consisting of silicon dioxide and polycrystalline silicon, on a face of a semiconductor substrate;
    patterning the masking layer to define a trench mask having a first opening therein which is defined by first sidewalls thereof and exposes the face;
    etching the semiconductor substrate to define a trench therein, using the trench mask as an etching mask; then
    enlarging the size of the first opening in the trench mask by simultaneously exposing the first and second materials to an etchant at the first sidewalls which etches nitride at a faster rate than the semiconductor substrate and at a faster rate than the second material; then
    filling the trench and the first opening with an electrically insulating region; and
    planarizing the electrically insulating region.

10. The method of claim 9, wherein said step of forming a trench masking layer comprises the steps of forming a pad oxide layer on a face of the semiconductor substrate and forming a silicon nitride layer on the pad oxide layer, opposite the face; and wherein said planarizing step comprises polishing and/or chemically etching the electrically insulating region, using the silicon nitride layer as a planarization stop.

11. The method of claim 9, wherein said step of forming a trench masking layer comprises the steps of:
    forming a pad oxide layer on a face of the semiconductor substrate;

forming a silicon nitride layer on the pad oxide layer, opposite the face; and forming a polycrystalline silicon layer on the silicon nitride layer.

12. The method of claim 11, wherein said planarizing step comprises polishing and/or chemically etching the electrically insulating region, using the polycrystalline silicon layer as a planarization stop.

13. The method of claim 9, wherein said step of forming a trench masking layer comprises the steps of forming a pad oxide layer on a face of the semiconductor substrate; forming a silicon nitride layer on the pad oxide layer, opposite the face; and forming a silicon dioxide layer on the silicon nitride layer; and wherein planarizing step comprises polishing and/or chemically etching the electrically insulating region and the silicon dioxide layer, using the silicon nitride layer as a planarization stop.

14. The method of claim 9, wherein said enlarging step comprises exposing the trench mask to a phosphoric acid solution at a temperature of greater than about 140° C., for a duration greater than about 10 minutes.

15. The method of claim 9, wherein said enlarging step comprises exposing the trench mask to a phosphoric acid solution to recess an edge of the trench mask at the first opening by greater than about 500 Å from an edge of the trench.

* * * * *